(12) United States Patent
Natzle (10) Patent No.: US 6,171,971 B1
(45) Date of Patent: Jan. 9, 2001

(54) FREESTANDING MULTILAYER WIRING STRUCTURE

(75) Inventor: Wesley Charles Natzle, New Paltz, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/362,502

(22) Filed: Jul. 30, 1999

Related U.S. Application Data (62) Division of application No. 09/064,546, filed on Apr. 22, 1998, now Pat. No. 6,097,092.

(51) Int. Cl.[7] .................................................. H01L 21/00
(52) U.S. Cl. .......................... 438/706; 438/743; 216/17; 216/39
(58) Field of Search .................................. 438/706, 710, 438/723, 743; 216/17, 18, 19, 39

(56) References Cited

U.S. PATENT DOCUMENTS

| | | | |
|---|---|---|---|
| 4,840,923 | * 6/1989 | Flagello et al. | ........................ 216/18 |
| 4,899,439 | 2/1990 | Potter et al. . | |
| 5,144,411 | 9/1992 | Kaanta . | |
| 5,227,013 | * 7/1993 | Kumar | .................................. 216/18 |
| 5,227,658 | 7/1993 | Beyer et al. . | |
| 5,324,683 | 6/1994 | Fitch et al. . | |
| 5,338,975 | 8/1994 | Cole, Jr. et al. . | |
| 5,444,015 | 8/1995 | Aitken . | |
| 5,572,042 | 11/1996 | Thomas et al. . | |
| 5,662,772 | * 9/1997 | Scheiter et al. | .................. 438/743 X |
| 5,922,623 | * 7/1999 | Tsutsui et al. | ....................... 438/743 |
| 5,935,868 | * 8/1999 | Fang et al. | ......................... 216/18 X |

* cited by examiner

Primary Examiner—William Powell
(74) Attorney, Agent, or Firm—McGuireWoods LLP; Jay H. Anderson (57) ABSTRACT

A dielectric wiring structure and method of manufacture therefor. Successively formed wiring layers synergistically combine with subsequently formed sidewall supports spanning two or more layers to form a self supporting air dielectric interconnection matrix. Wires are supported by vertical nitride sidewalls which are, in turn, held in place and supported by the wires. After forming the complete wiring-sidewall structure, $SiO_2$ between and under the wires is removed using gaseous HF at a partial pressure between 5 and 30 Torr. The metal wires may be clad with nitride for short and oxidation protection. Because sidewalls are formed after wiring, with the wiring at each level providing support definition, complex support alignment is unnecessary.

24 Claims, 8 Drawing Sheets

FREESTANDING MULTILAYER WIRING STRUCTURE

This is a divisional application of U.S. application Ser. No. 09/064,546, filed on Apr. 22, 1998, now U.S. Pat. No. 6,097,092.

BACKGROUND OF THE INVENTION

1. Field of the Invention

The present invention is related to Integrated Circuits (ICs) and, more particularly, to ICs having air dielectric wiring for reduced capacitance.

2. Background Description

Integrated circuit (IC) performance is dependent upon individual circuit performance. Individual circuit performance is dependent on the load the circuit must drive. For field effect transistor (FET) circuits, the primary load is capacitive. The primary source of the circuit load capacitance is inter-circuit wiring capacitance. Thus, IC performance can improved by reducing wiring capacitance.

Typical IC chips with a large number of logic circuits include multiple layers of wires, called wiring layers, stacked one on top of another and separated by dielectric material. The ideal dielectric is air or, at least has the same dielectric constant as air. There are several approaches to providing an air dielectric in IC chips.

Freestanding Structures

One approach is to remove the dielectric around the wires, suspending the wiring in air. The suspended wires are uncovered with any dielectric and are supported, mechanically, only by interlevel metal studs used to form the circuit. Although scanning electron microscopic (SEM) images of such structures clearly show that small lengths of wire are self supporting, longer lengths of wire are not self-supporting. So, longer lengths of unsupported wire are susceptible to shorting.

For example, U.S. Pat. No. 4,899,439 entitled "Method of Fabricating A High Density Electrical Interconnect" to Potter et al. teaches building pillars from the substrate under the wires extending upward to upper wiring levels wherever support is required. However, because wiring channels must be allocated for these pillars, the pitch or density of wires is reduced by as much as half.

Another approach is to stiffen the wires, such as taught in U.S. Pat. No. 5,148,260 entitled "Semiconductor Device Having an Improved Air Bridge Lead Structure" to Inoue et al., wherein the metal lines are formed from a stiffer composite metal that is less likely to deform than typical wiring metals. This approach reduces, but does not eliminate shorting in an air dielectric IC structure. Further, Inoue et al., also requires including some support pillars, although not as many are required as in Potter et al.

Both Potter et al- and Inoue et al teach structures that are formed using conventional techniques, with the removable dielectric material removed through several repeating layers of metal studs and metal lines. Material may be backfilled around the freestanding wires to provide a dielectric other than air.

Gravity is the primary focus in abating shorting problems in prior art freestanding IC wiring structures. Thus, to counteract gravity, a strong support is provided from below the wires.

The above examples of the prior art incur a substantial wiring density penalty because the support pillars extend through several wiring levels, all the way up from an underlying substrate. These small diameter support pillars are formed level by level and so, must be lined up at each level with an underlying level.

To simplify this critical alignment requirement, a stiff intermediate planar layer may be formed on each support pillar level. Thus, the pillars would support the planar layer and the planar layer supports another pillar level. For this type structure, pillars need not line up from level to level. However, any dielectric must be removed after the planar layer is formed by complex venting and filling steps or the dielectric is trapped under the permanent planar layer.

A typical prior art approach, when using planar layers to construct freestanding structures, is to form an air dielectric on a layer by layer basis. For example, in U.S. Pat. No. 5,144,411 entitled "Method and Structure for Providing Improved Insulation in VLSI and ULSI Circuits", to Kaanta et al. (hereinafter Kaanta), a planar layer is formed above metal lines or on pedestals above the metal lines with a complex process requiring extra masks. Kaanta teaches etching access openings through the planar layer, removing the dielectric, plugging the openings, and then, continuing construction of subsequent layers.

U.S. Pat. No. 5,444,015 entitled "Larce (sic) Scale IC Personalization Method Employing Air Dielectric Structure for Extended Conductors" to Aitken et al. (Hereinafter Aitken), assigned to the assignee of the present invention, teaches an approach similar to Kaanta that reduces the extra masks by forming openings in a removable dielectric for studs and supports simultaneously.

The support dimensions in Aitken are much smaller than studs. After forming support openings, Aitken teaches depositing dielectric to dill the support locations and line stud openings. An anisotropic etch removes support dielectric at the bottom of the stud openings that are filled with metal in subsequent steps. Unfortunately, Aitken stud opening diameters must be significantly wider (twice the thickness of the dielectric tube) than the studs themselves, which must be significantly larger than the minimum process dimension.

Prior art structures are, typically, supported by pedestals. The circuit design tools must keep track of whether interlevel features are studs or pedestals. Further, circuit design is more complicated because the wiring and the support pedestals must be accounted for on each wiring level.

Materials and Processing

Materials used in prior art methods are exotic and, so, are expensive to develop and difficult to remove. Kaanta, for example, teaches using parylene as a removable dielectric. Parylene has a low decomposition temperature, which severely restricts the materials that can be used for the freestanding structures.

Furthermore, typical prior art methods use aqueous chemicals to etch the removable material. It is uncertain whether these aqueous chemicals can penetrate the convoluted paths to regions buried deep within the wiring that must be cleared of removable dielectric. In particular, when dielectric removal is deferred until the end, or, for structures with vented planar layers such as U.S. Pat. No. 5,324,683 to Fitch et al. entitled "Method of Forming a Semiconductor Structure having an Air Region" (which is even more complex than Kaanta), these aqueous chemicals penetrate vent holes with considerable difficulty.

Further, after reaction and drying, the reaction products may not be removed completely from the nearly enclosed air dielectric compartments. These small openings make it difficult for reactants to diffuse in, or for waste products to diffuse out, when the cavities are filled with a liquid.

Additional problems arise when aqueous HF is used to remove oxides from the exposed metal lines. The HF in the aqueous solution can attack the metal, especially when the lines are a composite metal. Electrochemical potentials further contribute to corrosion of one metal of the composite. Such an attack can result in open electrical circuits, higher line resistivity, and the metal lines separating from their supports.

Thus, there is a need for a way to remove dielectric from metal lines without attacking the metal, with adequate penetration of small openings and subsequent removal of reaction waste products from the structure. Further there is a need for a way to form air dielectric structures on integrated circuit chips without increasing the number of masks, requiring complex vent and fill procedures or difficult support alignment.

SUMMARY OF THE INVENTION

It is a purpose of the invention to provide a manufacturable integrated circuit structure with an air dielectric wiring;

It is another purpose of the present invention to anchor the wiring in an air dielectric structure for mechanical strength to minimize shorts between wires;

It is yet another purpose of the present invention to provide a manufacturing process for fabricating integrated circuit structures with air dielectric wiring;

It is yet another purpose of the present invention to simplify manufacturing integrated circuit structures with air dielectric wiring;

It is yet another purpose of the present invention to provide a method of manufacturing air dielectric structures that defines wiring support after wiring definition;

It is yet another purpose of the present invention to provide a method of manufacturing air dielectric structures that does not require removing the dielectric and forming wires on a weak substrate;

It is yet another purpose of the present invention to provide a method of manufacturing air dielectric structures using existing integrated circuits and materials to create the air dielectric structure.

The present invention is an air dielectric wiring structure and method of manufacture therefor. Successively formed wiring layers synergistically combine with subsequently formed sidewall supports to form a self supporting air dielectric interconnection matrix. Complex venting and plugging problems are avoided by using an easily removable dielectric, that is virtually completely removed. Wires are supported by vertical sidewalls instead of planar support layers, facilitating dielectric removal. An optional dielectric cladding may be left on the metal wires for short and oxidation protection. Because sidewalls are formed after wiring, with the wiring at each level providing support definition, complex support alignment is unnecessary.

In one preferred embodiment, sidewalls are formed after removing dielectric between the wires support and hold the otherwise free-standing wires in place. The sidewalls hold the wires vertically and connection between the successive perpendicularly aligned wiring levels interact to anchor each other. The preferred dielectric wiring structure may include a thin dielectric covering, preferably of the same material as the sidewalls, that completely or partially covers the wiring and extends from each wire's side down to lower levels of the air dielectric structure. The dielectric covering coats and protects the wires and anchors the wires in position. Thus, the incidence of shorting between wires in the air dielectric structure is reduced.

In the preferred methods of manufacturing the air dielectric structure, after in the prior art what would be completing wiring layers for an integrated circuit, dielectric, preferably $SiO_2$, is isotropically etched away in a pre-defined region, or anisotropically etched to a depth traversing at least a part of two or more wiring layers, leaving each wire on each exposed or partially exposed layer on lengthwise $SiO_2$ pillars. A conformal layer of etch resistant (to $SiO_2$) material is formed on the etched structure to form sidewalls at each $SiO_2$ pillar, i.e., at the edges of each exposed or partially exposed wire. Alternately, the previously removed (by the etch) $SiO_2$ may be replaced with etch-resistant material filling between the wires. The remaining $SiO_2$ fill is removed through vents formed in the etch-resistant material.

In another preferred embodiment, fill dielectric is anisotropically sub-etched away from the wiring layers by a first etch step, using the circuit wiring as an etch mask. The sub-etch traverses a portion of at least two orthogonally aligned wiring layers and terminates slightly before reaching an underlying etch resistant insulating material layer or at the layer, if the resistant insulating material layer is non-planar. A conformal layer of an etch resistant insulating material is applied. The structure is etched with an anisotropic etch to remove horizontal surfaces of the conformal coating and, especially to open the conformal layer at the bottom of the structure, thereby exposing the underlying fill dielectric. The exposed fill dielectric and all fill dielectric in contact with the exposed fill dielectric is then removed.

In one embodiment, the fill dielectric is silicon dioxide and the etch resistant insulating material is silicon nitride. The exposed silicon dioxide is etched using reactive ion etching (RIE) to a point above a silicon nitride layer. A thin layer of silicon nitride is then conformally deposited on the structure. A second anisotropic reactive ion etching step opens the silicon nitride and exposes the underlying silicon dioxide. A vapor HF etch is used to remove the remaining silicon dioxide until only the silicon nitride, the circuit wiring, or other etch resistant materials remain and are exposed to air. The result is a preferred embodiment integrated circuit with air dielectric wiring having a thin silicon nitride layer stabilizing and holding the suspended wires in their original position.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

The inventor of the present invention discovered that gaseous HF may be used to remove silicon dioxide ($SiO_2$) from a layered wiring structure without the normal damage to the wires. The damage that occurred in prior art methods was the result of using an aqueous solution to remove fill dielectric. The prior art aqueous solution invariably attacked the metal wires as it removed the fill dielectric. Although gaseous HF has been used to remove thin reactive ion etch (RIE) residues from metal lines, it was heretofore believed that the long exposures necessary for oxide dielectric removal were similarly corrosive.

However, as the inventor has found, using gaseous HF, preferably at a partial pressure between 5 and 30 Torr., $SiO_2$ may be stripped completely away from a wiring structure, leaving the metal wires and studs behind unharmed. The gaseous reaction operates through formation of a thin aqueous film.

As a result of that discovery, the inventor further discovered that, in the microscopic world of these IC wires, other residual forces from stresses and strains introduced during construction overshadow gravitational forces. By removing the $SiO_2$ dielectric that normally encases long IC wiring runs, the freestanding wires are as likely to relax in a lateral or even an upward direction as in a downward direction, i.e., they will bow up, down or sideways.

Consequently, in the preferred embodiment a gaseous material, preferably gaseous HF, is used to remove fill material, preferably $SiO_2$, encasing a wiring structure. As fill material is removed, sidewall supports are formed to hold the wires in place. Thus, structures, formed according to the preferred embodiment method, have wires that are supported in all directions.

Figure 1:
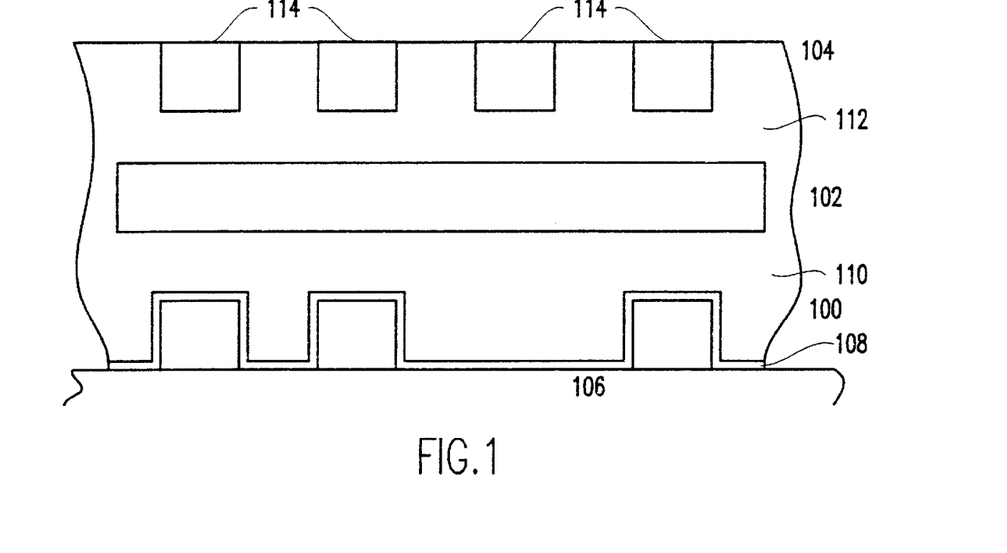
FIG. 1 is a cross-sectional view of wiring, which is preferably in an integrated circuit with three (3) wiring layers.

Referring now to the drawings, and more particularly to FIG. 1 which is a cross-sectional view of wiring, which is preferably in an integrated circuit with three (3) wiring layers 100, 102, 104. The wiring layers 100, 102, 1041 are typically a metal such as aluminum or copper. The preferred air dielectric wiring structure, which is formed from the structure of FIG. 1 may be limited to a specific area of a chip or may encompass an entire chip.

Although generally referred to herein as metal wiring surrounded by an air dielectric, the present invention may be applied to any microstructure that is desired to be freestanding, or entirely unsupported by underlying material layers. Further, as described herein, the air dielectric structure is shown as being formed in metal wiring layers 100, 102 and 104. However, an air dielectric structure may extend above and below layers 100, 102 and 104 and throughout the layers of an integrated circuit chip with a bottom layer being a polysilicon gate layer.

Thus, to form a preferred embodiment air dielectric structure, first wiring layer 100 is formed above a semiconductor body 106 which may be a silicon substrate or, the surface of an insulator layer in, for example, a silicon on insulator (SOI) wafer. After forming the first wiring layer 100 according to any well known process, a thin etch resistant layer 108, preferably silicon nitride or diamond-like crystallized carbon, is formed on the wiring layer 100, at least in an area where a preferred air dielectric structure is to be formed. A first fill material layer 110, e.g. an oxide layer, is formed on the thin etch resistant layer 108. The second wiring layer 102 is formed on the first insulating layer 110. A second fill layer 112 is formed on the second wiring layer 102 The second fill layer 112 is of the same type of fill material as in the first 110. The third wiring layer 104 is formed in the second fill layer 112 using a damascene process where metal is formed by: a) etching channels in layer 112; b) filling the channels with metal; and, then c) polishing the metal off the top of the insulator to leave it in the channels 114. Alternately, the third wiring layer 104 may be formed on the second fill layer 112 with fill material formed over the third wiring layer 104 to fill between the wires 114 in the third wiring layer 104.

Figure 2:
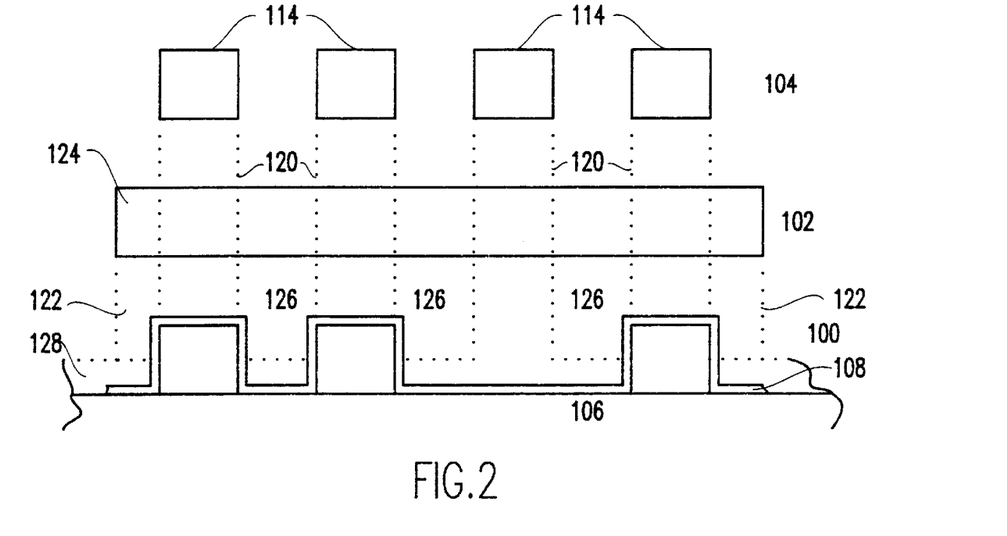
FIG. 2 shows the structure of FIG. 1 etched, with the wiring layers serving as masking layers to remove fill oxide from between wires and, thereunder, from fill layers.

Next, in FIG. 2, the structure of FIG. 1 is etched, preferably using an anisotropic reactive ion etch (RIE) with the wiring layers 100, 102 and 104 serving as masking layers to remove fill oxide from between wires 114 and, thereunder, from fill layers 110 and 112. The anisotropic RIE continues until the thin etch resistant layer 108 on the semiconductor body 106 is exposed or nearly exposed. The RIE leaves walls 120 standing beneath wires 114 and walls 122 beneath wires 124 on the second metal layer 102. By ending the RIE prior to re-exposing all of thin etch resistant layer 108 in spaces 126, a thin insulating layer 128 remains.

Further, to protect the topmost wiring layer from attack during RIE removal of the fill oxide, a patterned resist material layer having the same pattern as the topmost wiring layer may be added to protect the upper wiring layer. Thus, for example an upper aluminum wiring layer may be protected using the same resist used to define the metal. Thus, immediately after patterning the metal, before stripping the photoresist the oxide is removed in a RIE step.

Figure 3:
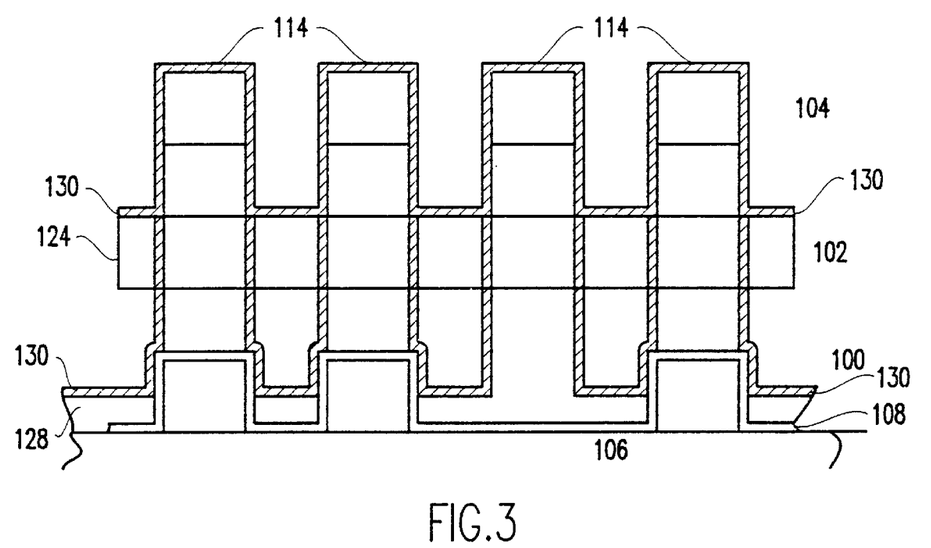
FIG. 3 shows a conformal layer of etch resistant material is formed on the structure of FIG. 2.

Next, in FIG. 3, a conformal layer 130 of etch resistant material is formed on the structure of FIG. 2. Preferably, the etch resistant material is silicon nitride. The conformal layer 130 coats the top and side of third wiring level 104, the top and side of the regions of second wiring level 102 that were not masked by third wiring level 104, the top and part of the side of wiring level 100, not masked by 102 or 104 and the sides of oxide walls 120, formed during the anisotropic RIE etch.

Figure 4:
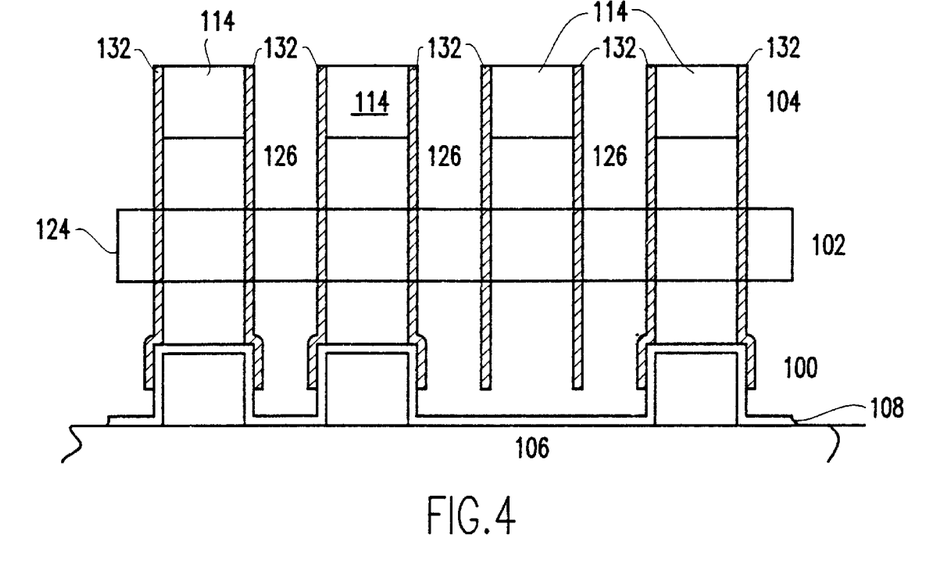
FIG. 4 shows horizontal portions of conformal layer removed to leave sidewalls.

Horizontal portions of conformal layer 130 are removed using an appropriate anisotropic RIE, leaving sidewalls 132 in FIG. 4 and re-exposing the remaining thin fill layer 128. This re-exposed thin fill layer 128 provides an access to all or nearly all of the remaining fill material. The fill material, which is preferably $SiO_2$, must be etchable using gaseous HF, preferably at a partial pressure between 5 and 30 torr, with high selectivity to the metal in metal layers 100, 102 and 104 and to the sidewall material. Further, it must be removable both by an anisotropic etch, and by an isotropic etch.

An isotropic etch using gaseous HF removes all of the remaining accessible fill material through the accesses, i.e., all fill material between sidewalls 132 under wiring layers 102 and 104, as well as layer 128, leaving behind a honeycomb-like sidewall structure. Thus, virtually all of the fill material is removed, leaving behind the wires in layers 100, 102 and 104 held in place by the honeycomb-like sidewalls 132. The synergistic matrix of interconnected wires and sidewalls so formed is self supporting.

It is important to note that for preferred embodiment wiring, sidewall pedestals between wiring layers need not be aligned throughout the resulting multilayer structure. It is only necessary that each sidewall pedestal rest on or support either another sidewall pedestal or, a previous/subsequent level wire. Furthermore, it is unnecessary that each sidewall pedestal align with a sidewall pedestal in adjacent layers. It is only necessary that each sidewall pedestal intersect with another sidewall pedestal in an adjacent layer. A thin, sub-lithographic layer of dielectric material sidewall may both sufficiently support the wiring and partially coat the wires with dielectric (protecting them from shorts) without requiring extra masks. As a result a large percentage of volume of the final structure is air.

The sidewall pedestals may rest on and be supported by studs of an underlying wiring level, or by a stiff overlying layer, or some combination of the two. If the sidewall pedestals do contact an underlying substrate it is advantageous that they contact a non-planar substrate, so that the sidewall pedestals do not seal in the removable fill material, i.e., the $SiO_2$ pedestals.

The resulting structure is shown in FIG. 4. There is no oxide between metal levels 100, 102 and 104. A thin nitride sidewall 132 is shown between metal lines 114. There is a thin nitride sidewall along certain portions of wires in layer 102 (i.e. those not masked by lines 114), and thin vertical nitride plates (coplanar with the sidewalls of metal lines 114) join orthogonal vertical nitride plates at wiring layer 102. Although these nitride sidewalls have a higher effective dielectric than air, they provide needed vertical and lateral rigidity, holding the wires against any lateral motion.

Although the method of the preferred embodiment may be used to form a single suspended wire, preferably it is used to form multiple levels of wires in a complex structure. Increased rigidity and improved electrical insulation from the preferred embodiment also prevents shorts from deformed wiring observed with prior art freestanding wire.

The final etch in the preferred embodiment is an isotropic oxide etch which must etch oxide with high selectivity to the metal lines and the nitride masking layers and, further, through channels with a very high aspect ratio. The worst case aspect ratios encountered are when directionally oriented wiring layers align and have the same pitch, e.g. layers 100 and 104 in FIG. 4. In such a case, if there are no wires on wiring level 102, then the length of a high aspect ratio channel being etched is as long as the wires run aligned on the two levels. For this case, HF vapor is sufficiently selective and penetrates these high aspect ratio structures adequately. In general, however, most channels will have much lower aspect ratios because wiring layers will not have the same wiring pitch and so, will not be in registration with each other.

In an alternate embodiment wiring layer 100 is formed in an undoped oxide. Fill layers 110 and 112 at wiring layers 102 and 104 are doped silicon dioxide such as phosphosilica glass (PSG). Since, vapor HF etches PSG with high selectivity to undoped silicon dioxide, in this embodiment etch resistant nitride layer 108 may be eliminated. After stripping PSG, stripping ends at the underlying undoped silicon dioxide, making nitride layer etch resistant layer 108 unnecessary.

Further, although nitride is the preferred etch resistant material for sidewalls, other suitable materials, such as diamond or diamond-like carbon which is resistant to etching by vapor HF, and has a low dielectric constant may be used as well. A suitable sidewall material must be an electrical insulator capable of forming along sidewalls, providing structural support, and must be etch resistant to the etch used to remove the fill material when form the air dielectric.

In a second alternate embodiment, the fill material is silicon and the sidewalls are formed by oxidation of the silicon. After silicon oxidation, the remaining underlying silicon may be removed with an isotropic, wet etch using, for example KOH or pyrocatechol. Optionally Chemical Dry Etching (CDE) or another appropriate dry etch may be used to remove the silicon.

In yet another alternate embodiment, the fill material is removed by dissolution. Using, for example a damascene process to define metal patterns directly in a layer of photoresist, the photoresist is anisotropically etched with the metal lines as a mask. Then, a sidewall is deposited. The bottoms of the sidewall are etched using a RIE. Then, the remaining photoresist is removed with a solvent. Alternately, a downstream or other plasma source may be used to remove the residual photoresist. Further, the fill material may be a water soluble inorganic, such as boron or germanium oxides. Many organics and inorganics can be easily removed by evaporation or thermal decomposition. Thus, making the fill material of such an organic or inorganic material, it may be removed by thermal decomposition or by evaporation.

Figure 5:
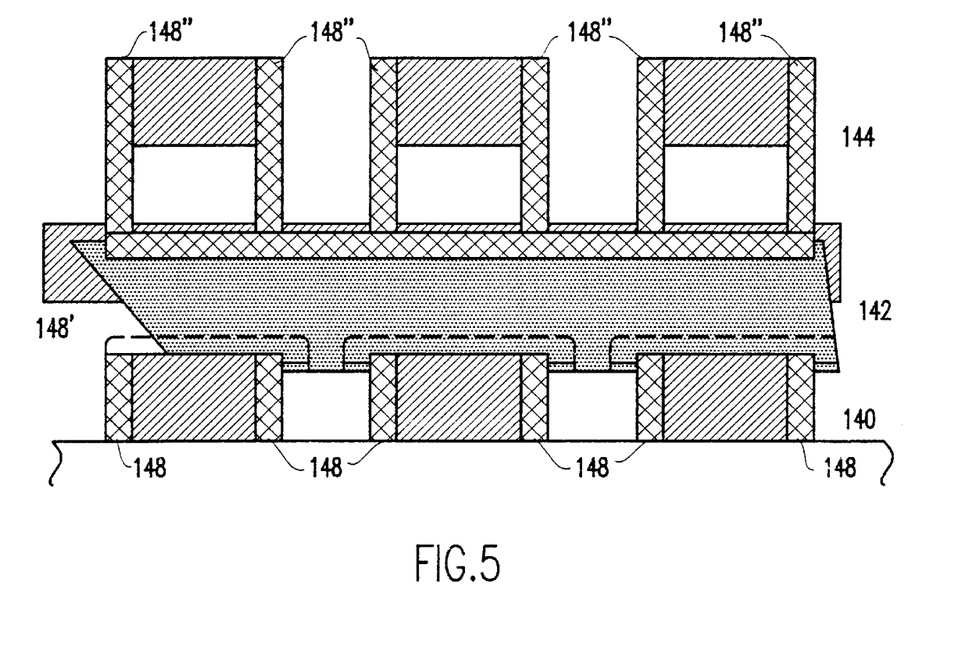
FIG. 5 shows an alternate embodiment wherein to minimize exposing the wiring layers to oxide RIE, the sidewall layer is formed stage by stage as each wiring layer is formed.

Alternately, to minimize exposing the wiring layers 100, 102 and 104 to the oxide RIE, the sidewall layer may be formed stage by stage as each wiring layer is formed as represented in FIG. 5. In this embodiment, each wiring layer 140, 142 and 144 masks oxide during RIE down to the next, lower wiring level. Further, as provided above, photoresist from patterning the wiring layer 140, 142 and 144 may be left on the wiring pattern to protect it during the RIE. In this alternate embodiment, sidewall pedestals are present along the entire length of each wire at each level and so, are present in areas that were masked by overlying wiring patterns in the preferred embodiment. These extra sidewalls form because sidewall layers are formed as each wiring layer is formed instead of deferring sidewall layer formation until the last wiring layer is formed.

Although each stage is described as a wiring layer, it is contemplated that a stage may be two or more layers and that the individual stages may each be different multiples of wiring layers. Thus, the first layer 140 of layered metal structure is formed of a conductive material such as aluminum, copper or the like, and patterned by any typical method. In this embodiment, as in the preferred embodiment, the wiring layer 140 or a resist cap (not shown) on the wiring layer 140 acts as a RIE mask. With the wiring layer as mask, fill material is removed from between the wire patterns.

A conformal sidewall layer 148 is deposited on the stripped wiring layer 140 and anisotropically etched to remove horizontal portions of the sidewall layer (not shown). A fill material is deposited to fill spaces between sidewalls, forming a planar surface. Each subsequent via or wiring layer, e.g., layers 144 and 146, is formed by repeating these steps, i.e., pattern wiring, RIE to strip fill down to the next lower wiring layer, deposit a conformal layer 148' and 148", anisotropic RIE to remove horizontal conformal layer portions and deposition of interlayer dielectric. After forming of all metal levels, the remaining fill is removed using a vapor HF process as described above in the preferred embodiment.

Figure 6:
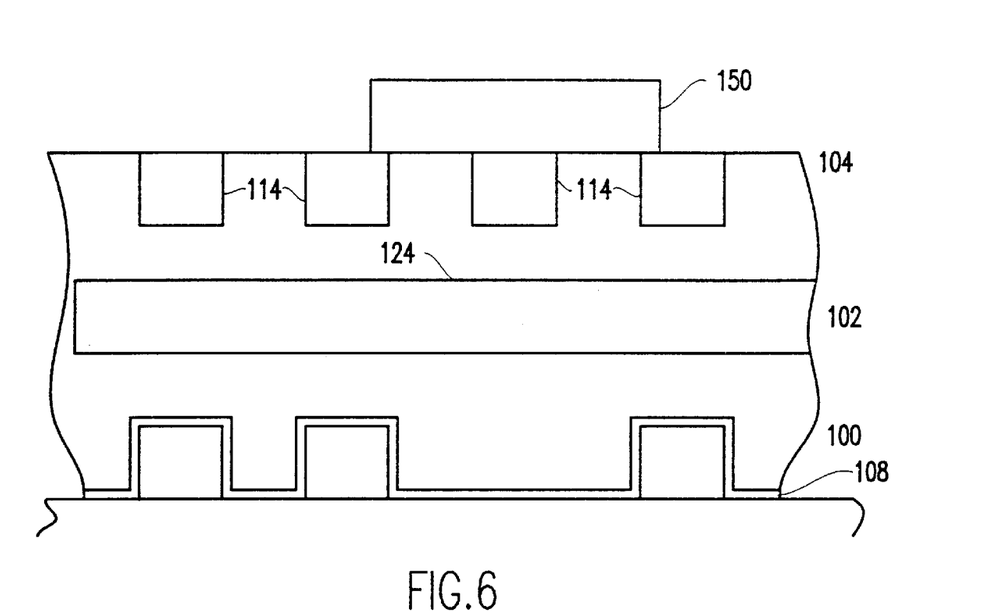
FIG. 6 shows another alternate embodiment wherein dummy sidewalls provide extra structural support and the conformal layer may be vented at a top surface using CMP.
Figure 7:
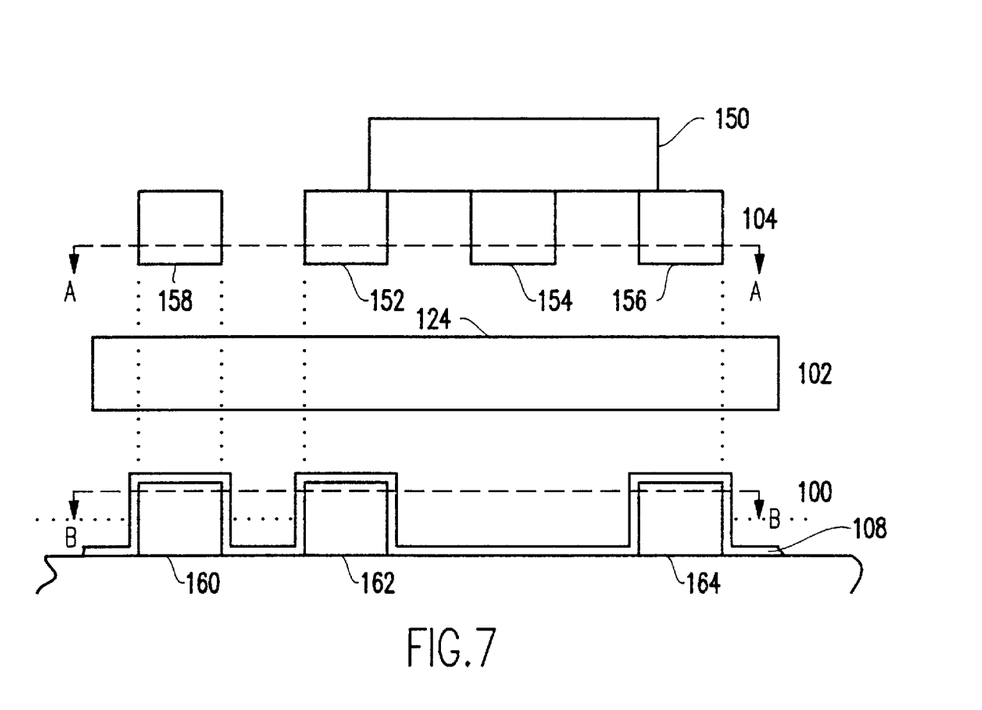
FIG. 7 shows after anisotropically etching the alternate embodiment of FIG. 6 wherein a resist pattern is transferred to the fill dielectric which is further patterned by wiring layers.

In another alternate embodiment shown in FIG. 6, an etch resistant pattern 150 may be formed over the upper metal wiring layer 104 to form a dummy sidewall pattern above wires 152, 154 and 156 of FIG. 7, leaving wire 158 exposed. In this embodiment, the dummy sidewalls provide extra structural support and, if the fill material is removed using chemical mechanical polishing (CMP) instead of RIE, pattern 150 provides a vent at the top surface. The resist pattern may be an anisotropic etch-resistant material or, a resist pattern transferred in a different etch resistant material, such as silicon nitride. Optionally, the etch resistant pattern 150 may be formed of an etch resistant material overlying an additional layer of removable material.

Next, in FIG. 7, after the anisotropic etch, the pattern defined by resist pattern 150 is transferred to the removable dielectric further patterned by wiring layers 100 (wires 160, 162 and 164), 102 and 104. In this alternate embodiment, a number of sides are removed that had remained in the preferred embodiment. In particular the sides that are masked by resist pattern 150 are not formed.

In this embodiment, after the anisotropic etch, a conformal sidewall material is deposited as in the preferred embodiment. Sidewall material may be deposited before or after removing the patterned etch resistant material 150. For this embodiment, the conformal sidewall layer may be vented either: by an anisotropic etch removing portions of the conformal layer from horizontal surfaces, as described hereinabove or, by using CMP to polish portions away from the upper horizontal surfaces. Optionally, if the topmost surface of the region protected by the resist mask 150 may be polished down to expose removable material; then, CMP may be used to form a vent by removing the top surface until underlying removable material is exposed.

Figure 8A:
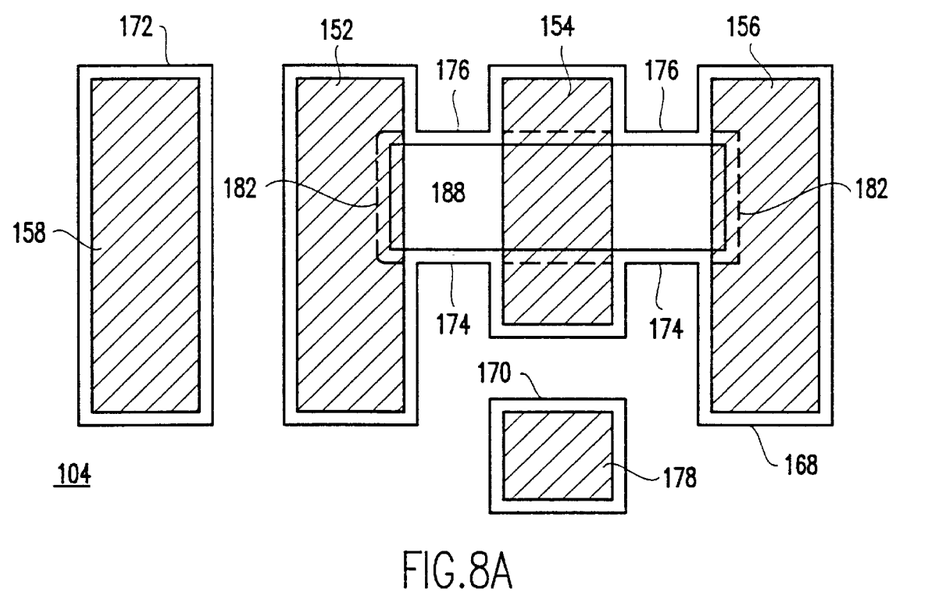
FIG. 8A is a top view of the wiring and the sidewall formed at the top wiring layer of FIG. 7.
Figure 8B:
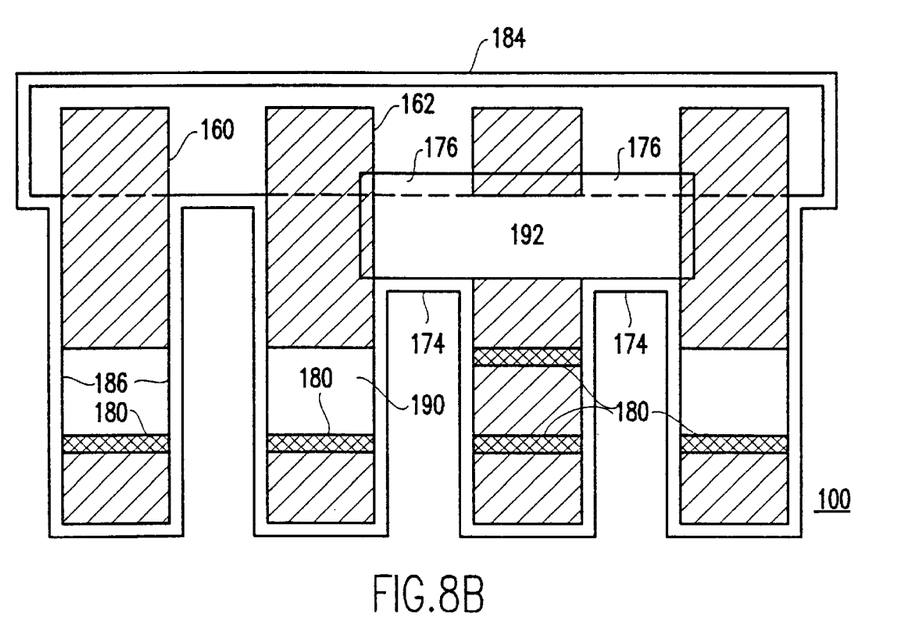
FIG. 8B is a top view of the wiring and the sidewall formed at bottom wiring layer of FIG. 7.

FIG. 8A is a top view of the structure of FIG. 7 through A—A, showing the wiring and the sidewall formed at wiring layer 104. FIG. 8B is a top view of the wiring and the sidewall formed at wiring layer 100 of FIG. 7 through B—B, showing sidewall 184 formed as a result of masking from overlying metal line 124 in metal layer 102. Sidewalls 184 extend down from the wiring layer 102 down to wiring layer 100 and are freestanding at wiring layer 100 and unattached to wiring layer 100. Regions 174 are defined by resist pattern 150, and attach adjoining wires in layers 100 and 104. Sidewall regions 176 are defined by resist pattern 150, and are attached to wiring layer 104, but terminate at the top of wire 124. Sidewall regions at the upper ends (in FIG. 8A) of wires 152–158 are defined by wiring layer 104 (wires 152–158) and terminate at the top of wire 124 in wiring layer 102. Sidewall regions at the lower edges of wires 152–158 and the upper edge of wire 178 are defined by wiring layer 104 and extend down to and terminate at the top of wiring layer 100 in regions 180.

An additional sidewall 182 extends upward from the top of wiring layer 104 and is present only if the resist pattern 150 is present before the conformal layer is deposited. In this case, sidewalls 174, 176 also extend upward from the top of wiring layer 104. Sidewalls 176, 174 provide additional lateral support for lines on wiring layer 104. Sidewalls 174 and 184 provide extra lateral support for lines on wiring layer 100. Sidewall 184 is defined by a metal line 124 on wiring layer 102 and is freestanding at layer 100. Sidewall 184, along wiring layer 102, as well as wiring layer 102 itself provide lateral support to wire 158. Lateral support to line 124 is provided by intersection with sidewalls from lines 152, 154, 156 and 158 in overlying layer 104.

When removing the fill dielectric, the fill dielectric under line 158 on wiring layer 104 is vented from wiring layer 100 between the freestanding sidewalls 186. Line 152 is vented from regions 190 and 192 in layer 100 and region 188 at the upper wiring layer 104. While in this example the dielectric under line 178 would not be vented, this can occur only if there is overlapping wiring of the same pitch and features.

Figure 9:
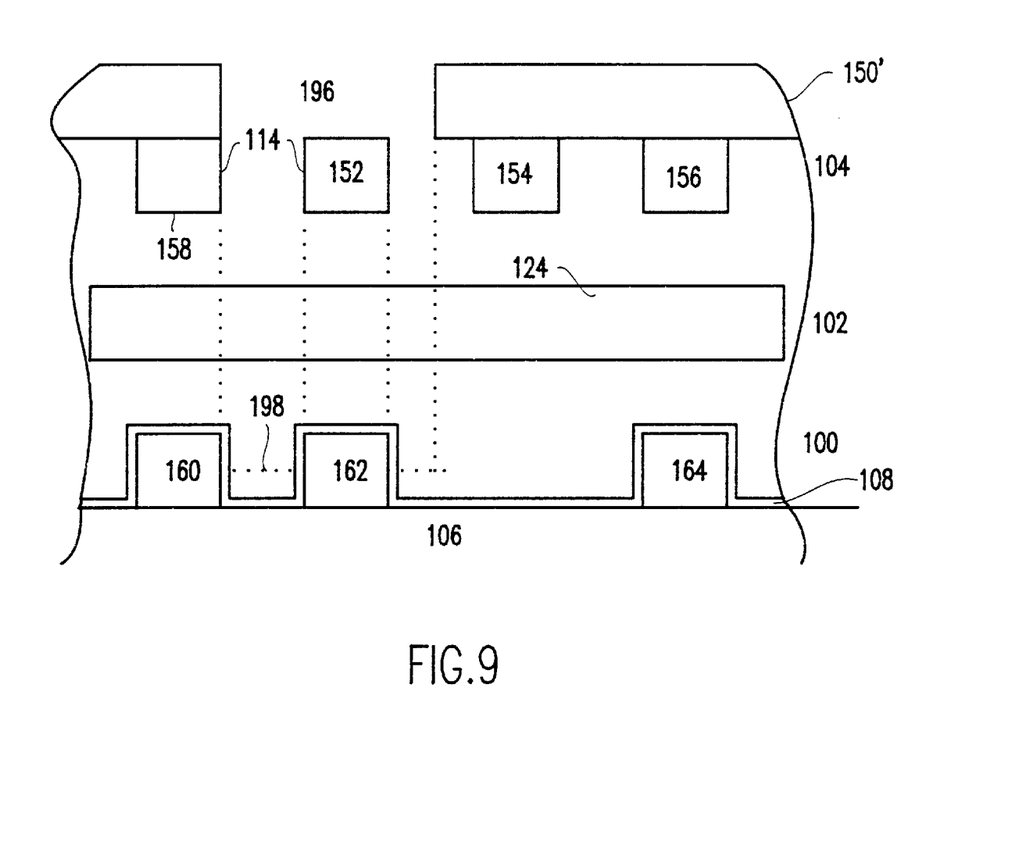
FIG. 9 shows a variation on the alternate embodiment in FIG. 7, wherein the surface is masked by resist and supports are formed only in small unmasked regions.

In a variation on this alternate embodiment, as shown in FIG. 9, most of the surface is masked, instead of small localized regions and, selected areas 196 are opened through a mask 150' layer. Preferably, an anisotropic etch is used to open the openings 196. The etch resistant layer 150' may be a composite layer, such as an oxide, nitride, photoresist combination. The structure of FIG. 9 may be coated with a conformal layer, or may be filled with a non-removable material. The mask is vented or removed at the top surface by patterned RIE or CMP before removing the fill material. Alternatively, if the fill opening 196 is coated with a conformal layer, then, anisotropic etching will open vents in region 196 at 198. If etch resistant layer 150' is an oxide fill-nitride composite and the vents are plugged after the oxide fill is removed, then the nitride sublayer of etch resistant layer 150' forms a sealed layer, suspended above the entire wiring structure.

Thus, the methods of the present invention define supporting sidewall pedestals after the wiring is defined. The sidewall pedestals are etched by techniques that leave wiring substantially intact and are formed after the wiring is formed on or in a removable dielectric. If a directional etch is used to define the sidewall pedestals, then wiring acts as a mask to underlying removable material, and the sidewall pedestals are mainly to the side of the supported wires.

Further, the preferred removable dielectric is silicon dioxide, widely used in integrated circuit devices. Thus, the present invention does not require extensive process development that might otherwise be required when using completely new combinations of metal, dielectric, and sidewall. The present invention adds only an oxide RIE step, a sidewall deposition step, sidewall RIE open, and dielectric removal step to well known integrated circuit fabrication processes. With the possible addition of an optional step of including a single buried nitride layer to block vapor HF from attacking underlying silicon, these additional steps may all occur after the circuit itself is complete. Thus, the present invention is based on well known techniques of building wires in $SiO_2$ that are not available in using completely new structures with dielectrics such as parylene that lack capability of deferred dielectric removal.

Figure 10:
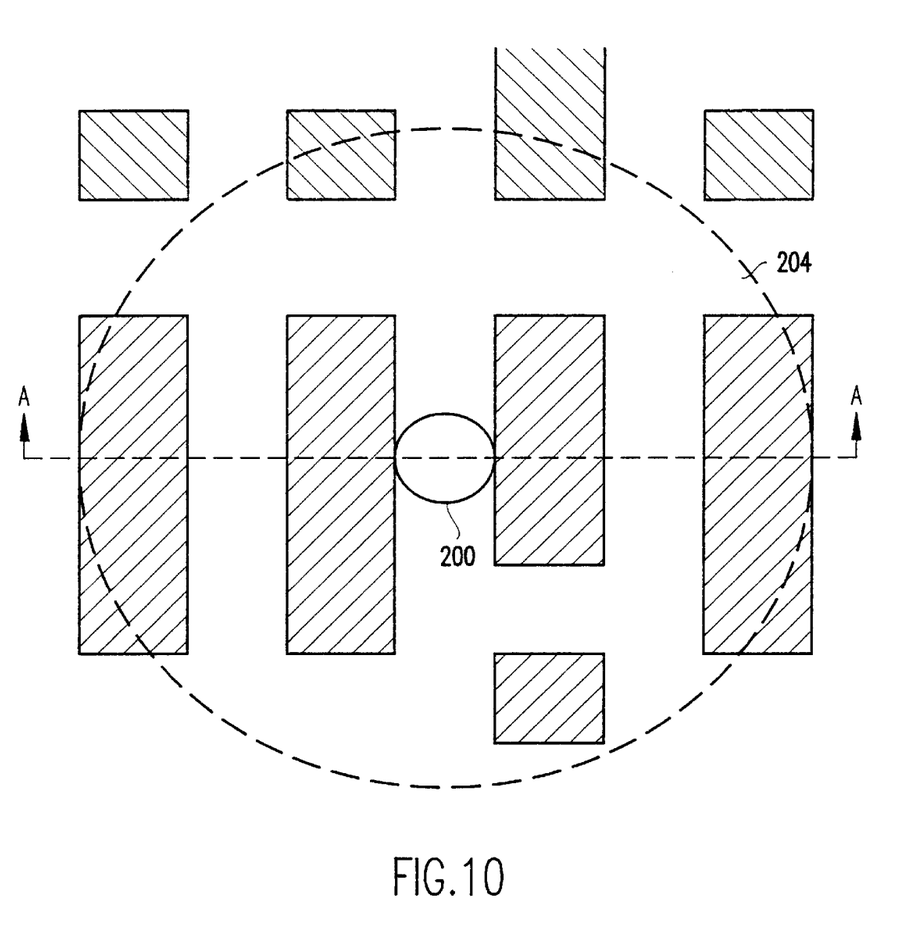
FIG. 10 shows a top view of another alternate embodiment wherein, instead of using an anisotropic etch, an isotropic etch is used to form the wiring supports.
Figure 11:
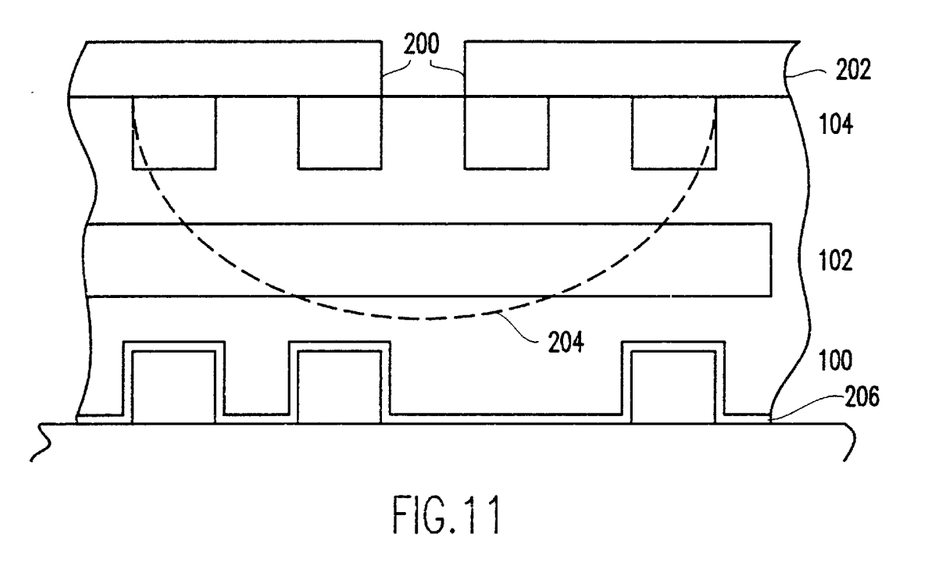
FIG. 11 is a cross-section of the embodiment of FIG. 10 at A—A.

FIG. 10 shows a top view of another alternate embodiment wherein, instead of using an anisotropic etch, an isotropic etch is used to form the wiring supports. FIG. 11 is a cross-section of the embodiment of FIG. 10 at A—A. In this embodiment, a small opening 200 (which may be one opening in an array of such openings) is defined through a layer of isotropically etch resistant material 202. Fill dielectric ($SiO_2$) is removed to just below the next underlying layer 102, as represented by dotted line 204. Non-planar continuous layer 206 is a layer of material or layered material that is impermeable to whatever etchant is used to remove the fill material.

A conformal sidewall layer may be formed before or after removing resist layer 202. Alternatively, the space left by fill material removal may be filled with etch resistant material. Vents may be opened in the sidewall layer (not shown) at the bottom of space 204 using a RIE to allow fill material removal. Alternatively, CMP or RIE may be used at the upper surface to open vents. Venting may be done using isotropic etching, anisotropic etching or combinations thereof. An isotropic etch is then used to remove any remaining fill material.

Optionally, in any of the above embodiments, dummy wires may be selectively included with the circuit wiring to provide additional wiring support. Further, not all of the fill material may be removed. Some material may be left behind for added strength, while some is removed for wiring improved capacitance.

As described herein, the preferred embodiments include wiring structures from which $SiO_2$ has been removed using gaseous HF. Prior art wiring structures may be improved using an $SiO_2$ fill which is subsequently removed using gaseous HF. For example support type wiring structures may be formed much more simply by forming the HF resistant supports in $SiO_2$ and then removing the $SiO_2$ using gaseous HF.

While the invention has been described in terms of preferred embodiments, those skilled in the art will recognize that the invention can be practiced with modification within the spirit and scope of the appended claims.

I claim:

1. A method of forming a low dielectric wiring structure comprising the steps of:
    a) forming a layered wiring structure including at least two wiring layers, $SiO_2$ filling spaces between wires on said at least two wiring layers; and,
    b) etching said layered wiring structure with gaseous HF to remove said $SiO_2$.

2. The method of claim 1, wherein during the step (a) of forming the layered wiring structure, a dielectric layer is formed over a first of said at least two wiring layers, said dielectric layer being resistant to etching by gaseous HF.

3. The method of claim 1, wherein during the step (b) of etching said layered wiring structure a first portion of said $SiO_2$ is removed and a dielectric layer is formed over said partially etched layered wiring structure, said dielectric layer being resistant to etching by gaseous HF.

4. The method of claim 3 wherein the gaseous HF is maintained at a partial pressure between 5 and 30 Torr.

5. A method of forming an air dielectric wiring structure from a layered wiring structure, said method comprising the steps of:
    a) selectively etching fill material from said layered wiring structure to expose sides of wires on wiring layers in said wiring structure;
    b) forming an insulator layer on said etched layered wiring structure; and,
    c) selectively etching said layered wiring structure with an isotropic etchant to remove remaining fill material.

6. The method of claim 5 wherein in the step (b) of forming the insulator layer, a conformal insulator layer is formed.

7. The method of claim 6 wherein an anisotropic etchant is used in step (a) to selectively etch fill material.

8. The method of claim 7 wherein in the step (a) of selectively etching fill material, a plurality of wires on at least one of said wiring layers masking an underlying one of said wiring layers.

9. The method of claim 8 wherein in the step (a) of selectively etching fill material further comprises masking said layered wiring structure prior to selectively etching fill material.

10. The method of claim 9 wherein said layered wiring structure is masked with a mask having an upper layer resistant to said isotropic etchant.

11. The method of claim 10 wherein said layered wiring structure is masked with a mask including a layer resistant to fill material.

12. The method of claim 5 wherein said isotropic etchant is gaseous HF.

13. The method of claim 12 wherein the gaseous HF is maintained at a partial pressure between 5 and 30 Torr.

14. A method of forming an integrated circuit chip, said method comprising the steps of:
    a) forming a layered wiring structure including at least two wiring layers;
    b) selectively etching said layered wiring structure to remove fill material from between wires of each of said at least two wiring layers, wires on one or more of said at least two wiring layers masking fill material in layers therebelow;
    c) forming a conformal insulator layer on said etched layered wiring structure;
    d) etching said layered wiring structure with an isotropic etchant to remove remaining fill material.

15. The method of claim 14 wherein in the step (b) of selectively etching fill material further comprises masking said layered wiring structure prior to selectively etching fill material.

16. The method of claim 15 wherein said layered wiring structure is masked with a mask having an upper layer resistant to said isotropic etchant.

17. The method of claim 15 wherein said layered wiring structure is masked with a mask including a layer resistant to fill material.

18. The method of claim 14 wherein the fill material is $SiO_2$ and the isotropic etchant is gaseous HF.

19. The method of claim 18 wherein the gaseous HF is maintained at a partial pressure between 5 and 30 Torr.

20. The method of claim 19 further comprising after the step (c) of forming the conformal insulator layer, the step of:
    c1) removing horizontal portions of said conformal insulator layer.

21. The method of claim 20 wherein the conformal insulator layer is a layer of silicon nitride and the step (d) of etching $SiO_2$ with gaseous HF includes opening accesses in a silicon nitride layer over a lower wiring layer to expose $SiO_2$ thereunder.

22. A method of forming an air dielectric wiring structure, said method comprising the steps of:
    a) forming a first wiring layer;
    b) forming a nitride layer on said first wiring layer;
    c) forming $SiO_2$ on said first wiring layer;
    d) forming a second wiring layer on said $SiO_2$;
    e) etching $SiO_2$ from between wires said nitride layer remaining covered by $SiO_2$, wires on said second wiring level masking $Sio_2$ below said wires;

f) forming a conformal nitride layer on said second wiring layer, SiO$_2$ masked by said wires being encased by said conformal nitride layer;

g) repeating steps c–f until a selected number of wiring layers have been formed; and h) opening accesses in said nitride layer and etching remaining SiO$_2$ with gaseous HF to remove said remaining SiO$_2$.

23. The method of claim 22 further comprising after the step (f) of forming the conformal nitride layer, the step of:

f1) removing horizontal portions of said conformal nitride layer.

24. The method of claim 20 wherein the gaseous HF is maintained at a partial pressure between 5 and 30 Torr.

* * * * *